United States Patent
Chen et al.

(10) Patent No.: US 7,701,007 B2
(45) Date of Patent: Apr. 20, 2010

(54) THIN FILM TRANSISTOR WITH SOURCE AND DRAIN SEPARATELY FORMED FROM AMORPHUS SILICON REGION

(75) Inventors: Chi-Wen Chen, Minsyong Township, Chiayi County (TW); Ting-Chang Chang, Hsinchu (TW); Po-Tsun Liu, Hsinchu (TW); Kuo-Yu Huang, Baoshan Township, Hsinchu County (TW); Jen-Chien Peng, Jhubei (TW)

(73) Assignee: AU Optronics Corp., Hsin-Chu (TW)

( * ) Notice: Subject to any disclaimer, the term of this patent is extended or adjusted under 35 U.S.C. 154(b) by 816 days.

(21) Appl. No.: 11/393,742

(22) Filed: Mar. 31, 2006

(65) Prior Publication Data
US 2007/0052020 A1    Mar. 8, 2007

(30) Foreign Application Priority Data
Sep. 5, 2005    (TW) ............................... 94130427 A (51) Int. Cl.
*H01L 27/12*    (2006.01)
(52) U.S. Cl. .......................... 257/347; 257/57; 257/59; 257/E29.291
(58) Field of Classification Search .................... 257/57, 257/347, E29.273, E29.289, E29.291
See application file for complete search history.

(56) References Cited
U.S. PATENT DOCUMENTS
4,720,736 A * 1/1988 Takafuji et al. ............... 257/60
5,355,002 A    10/1994 Wu
5,757,028 A    5/1998 Sasaki et al.
5,828,082 A    10/1998 Wu
6,022,753 A    2/2000 Park et al.

(Continued)

FOREIGN PATENT DOCUMENTS
CN    1540426 A    10/2004

(Continued)

OTHER PUBLICATIONS
"An a-Si TFT With a New Light-Shield Structure and Its Applcation to Active-Matrix Liquid Crystal Displays", by M. Akiyama et al., 1988 IEEE, pp. 268-271.

*Primary Examiner*—Lynne A Gurley
*Assistant Examiner*—Vernon P Webb
(74) *Attorney, Agent, or Firm*—Rabin & Berdo, PC (57) ABSTRACT

A Thin Film Transistor comprises a gate electrode formed on a substrate; a gate insulation layer covering the gate electrode; an amorphous silicon (a-Si) region disposed on the gate insulation layer and above the gate electrode; a doped a-Si region formed on the a-Si region; the source and drain metal regions separately formed on the doped a-Si region and above the gate electrode, and isolated from the a-Si region; a passivation layer formed on the gate insulation layer and covering the source, drain and data-line (DL) metal regions; and a conductive layer formed on the passivation layer. The passivation layer has a first, second and third vias for respectively exposing the partial surfaces of the source, drain and DL metal regions. The first, second and third vias are filled with the conductive layer, so that the DL and source metal regions are connected via the conductive layer.

12 Claims, 6 Drawing Sheets

U.S. PATENT DOCUMENTS

| | | |
|---|---|---|
| 6,704,068 B2 | 3/2004 | Murade |
| 2003/0136971 A1* | 7/2003 | Rhee et al. .................... 257/98 |
| 2006/0124930 A1* | 6/2006 | Chen et al. .................... 257/57 |

FOREIGN PATENT DOCUMENTS

| | | |
|---|---|---|
| CN | 1670926 A | 9/2005 |
| TW | 405269 | 9/2000 |
| TW | 457725 | 10/2001 |

* cited by examiner

THIN FILM TRANSISTOR WITH SOURCE AND DRAIN SEPARATELY FORMED FROM AMORPHUS SILICON REGION

This application claims the benefit of Taiwan application Serial No. 094130427, filed Sep. 5, 2005, the subject matter of which is incorporated herein by reference.

BACKGROUND OF THE INVENTION

1. Field of the Invention

The invention relates in general to a thin film transistor (TFT) structure and method of manufacturing the same, and more particularly to the thin film transistor structure capable of reducing current leakage and method of manufacturing the same.

2. Description of the Related Art

Conventional computer systems have used cathode ray tube (CRT) technology for the computer display. However, in the past decade technological advances in thin film transistor (TFT) liquid crystal displays (LCDs) have made this an increasingly popular technology. The active matrix thin film transistor liquid crystal display (AM TFT-LCD) possesses several competitive advantages, including lighter weight and thinner profile. The consumers also demand the perfect images displayed on the AM TFT-LCD. The higher resolution of the display is achieved, the larger number of the scan lines is required. Also, each gate scan line has to be selected in a shorter time under the same frame time. The requirement of the on-and-off characteristic of the TFT is stricter for improving the performance of the display. For example, excess leakage current is not allowed when the TFT is in the off state.

In a TFT manufacturing process, the amorphous silicon (a-Si) layer is photosensitive and is likely to generate photocurrent and cause photocurrent leakage after being exposed to the light. For preventing the photocurrent leakage, an island-in structure of the TFT, which the pattern of amorphous silicon is restricted within the pattern of the gate electrode (i.e. a-Si fully blocked by the gate electrode), is provided.

Figure 1:
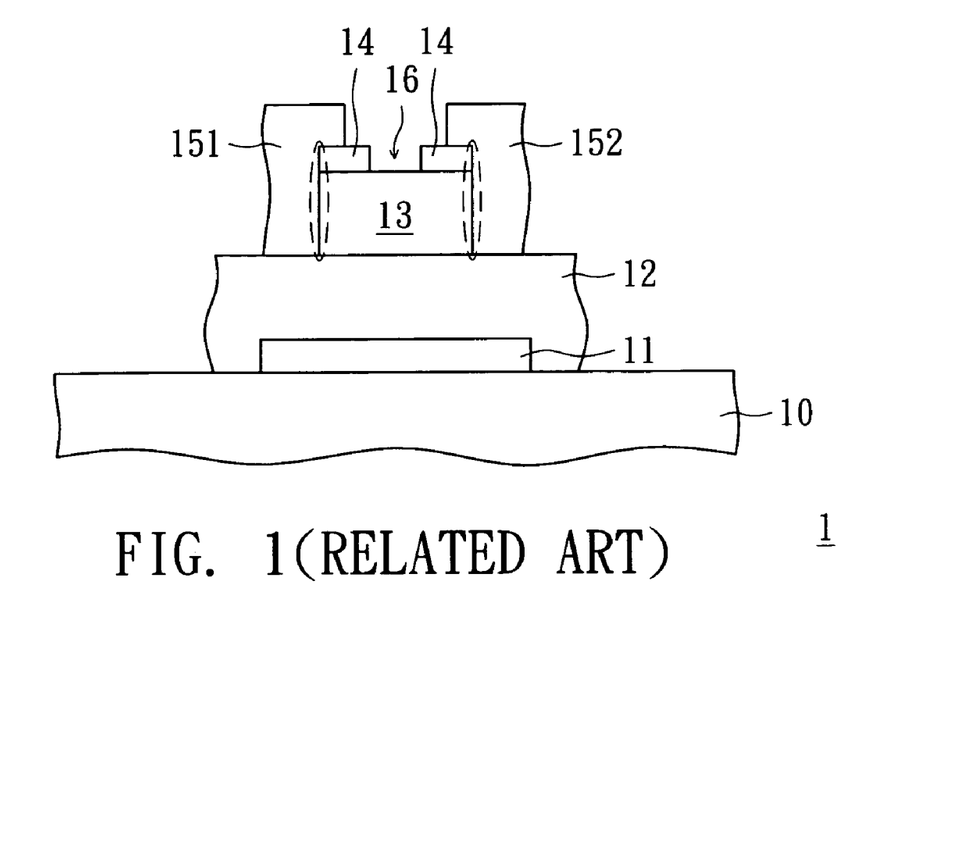
FIG. 1 (related art) is a cross-sectional view partially showing a conventional thin film transistor (TFT) device having an island-in structure.

FIG. 1 is a cross-sectional view partially showing a conventional thin film transistor (TFT) device having an island-in structure. The TFT 1 includes a substrate 10, a gate electrode 11 formed on the substrate 10 (by patterning the first metal layer), a gate insulation layer (such as a silicon nitride layer) 12, an amorphous silicon (a-Si) layer 13, a doped amorphous silicon (such as an n+ a-Si layer) 14, the source and drain regions 151, 152 (both formed by patterning the second metal layer). Also, the source region 151 and the drain region 152 are separated by a channel 16. The doped amorphous silicon layer 14 is formed for the purpose of increasing ohmic contact between the source region 151/the drain region 152 and the a-Si layer 13. Typically, the a-Si layer 13 and the doped a-Si layer 14 are so-called as the island structure. In FIG. 1, the bottom area of the a-Si layer 13 is smaller than that of the gate electrode 11, so that the TFT 1 presents an island-in structure.

According to the island-in structure of the TFT of FIG. 1, the a-Si layer 13 is shielded by the gate electrode 11, and no photocurrent leakage occurs when the TFT 1 is illuminated. However, the source region 151 and the drain region 152 (both made of the metal) direct contact the island structure (including the a-Si layer 13 and the doped a-Si layer 14), and this direct contact of a metal with a semiconductor is known as "Schottky contact". A leakage current path is thus formed. When a potential difference exists between the gate electrode 11 and the drain region 152, the current leakage is observed due to the "Schottky contact", and has the effect on the on-and-off characteristic of the TFT 1.

SUMMARY OF THE INVENTION

It is therefore an object of the invention to provide a thin film transistor (TFT) and method of manufacturing the same. By disposing the source and drain metal regions above the gate electrode and separated from the amorphous silicon, the current leakage of the TFT is sufficiently reduced.

The invention achieves the objects by providing a thin film transistor (TFT) applicable to a displaying device. The TFT comprises a gate electrode formed on a substrate; a gate insulation layer covering the gate electrode; an amorphous silicon (a-Si) region formed on the gate insulation layer and disposed above the gate electrode; a doped a-Si region formed on the a-Si region; a source metal region and a drain metal region separately formed on the doped a-Si region and disposed above the gate electrode, and the source metal region and drain metal region being separated from the a-Si region; a data line (DL) metal region formed on the gate insulation layer and spaced apart from the source metal region; a passivation layer formed on the gate insulation layer for covering the source metal region, the drain metal region and the DL metal region, and the passivation layer having a first via, a second via and a third via for respectively exposing partial surfaces of the drain metal region, the source metal region and the DL metal region; and a conductive layer formed on the passivation layer for filling the first via, the second via and the third via, so that the DL metal region and the source metal region are electrically connected.

The invention achieves the objects by providing a method of manufacturing a thin film transistor (TFT), comprising steps of:

forming a gate electrode on a substrate;

forming a gate insulation layer for covering the gate electrode;

forming an amorphous silicon (a-Si) region on the gate insulation layer, and the a-Si region disposed above the gate electrode;

forming a doped a-Si region on the a-Si region;

forming a source metal region and a drain metal region separately on the doped a-Si region, and the source metal region and the drain metal region disposed above the gate electrode and separated from the a-Si region;

forming a data line (DL) metal region on the gate insulation layer, and the DL metal region spaced apart from the source metal region;

forming a passivation layer on the gate insulation layer for covering the source metal region, the drain metal region and the DL metal region;

forming a first via, a second via and a third via in the passivation layer for respectively exposing partial surfaces of the drain metal region, the source metal region and the DL metal region; and forming a conductive layer on the passivation layer for filling the first via, the second via and the third via, so that the DL metal region and the source metal region are electrically connected.

Other objects, features, and advantages of the invention will become apparent from the following detailed description of the preferred but non-limiting embodiments. The following description is made with reference to the accompanying drawings.

BRIEF DESCRIPTION OF THE DRAWINGS

FIG. 2A~FIG. 2F schematically show the steps involved in the method of manufacturing the TFT according to the first embodiment of the invention.

FIG. 3A~FIG. 3F schematically show the steps involved in the method of manufacturing the TFT according to the second embodiment of the invention.

DETAILED DESCRIPTION OF THE INVENTION

In the present invention, the structure of the semiconductor such as thin film transistor (TFT) is improved for reducing the current leakage. Two embodiments are disclosed herein are for illustrating the invention, but not for limiting the scope of the invention. Additionally, the drawings used for illustrating the embodiments of the invention only show the major characteristic parts in order to avoid obscuring the invention. Accordingly, the specification and the drawing are to be regard as an illustrative sense rather than a restrictive sense.

First Embodiment

Figure 2A:
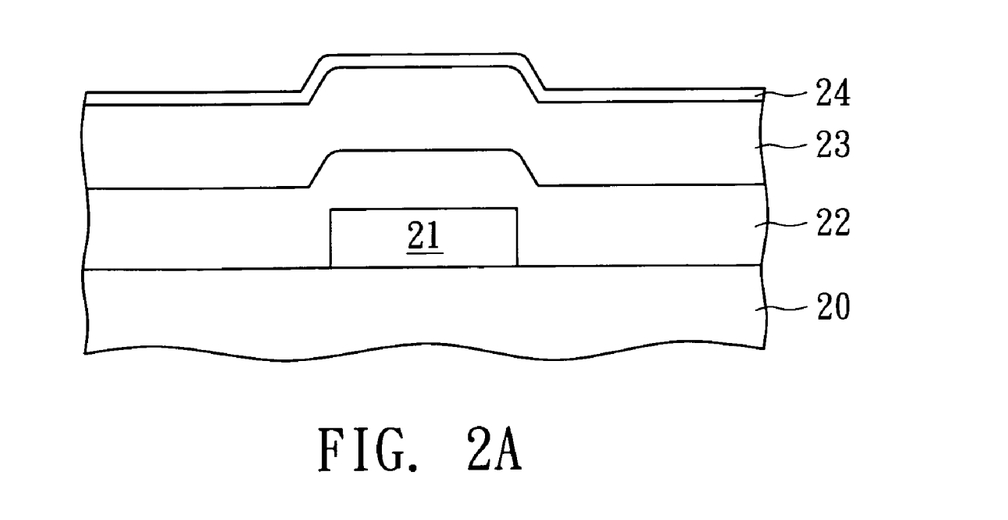

FIG. 2A~FIG. 2F schematically show the steps involved in the method of manufacturing the TFT according to the first embodiment of the invention. First, a substrate 20 is provided, and a gate electrode 21 is formed on the substrate 20. Then, a gate insulation layer 22 is formed on the substrate 20 to cover the gate electrode 21. An amorphous silicon (a-Si) layer 23 is further formed on the gate insulation layer 22, and a doped a-Si layer (such as the n+ a-Si layer) 24 is formed on the a-Si layer 23, as shown in FIG. 2A.

During the formation of the gate electrode 21, a first metal layer is formed on the substrate 20 and then patterned to be the gate electrode 21. The gate insulation layer 22 could be made of silicon nitride.

Figure 2B:
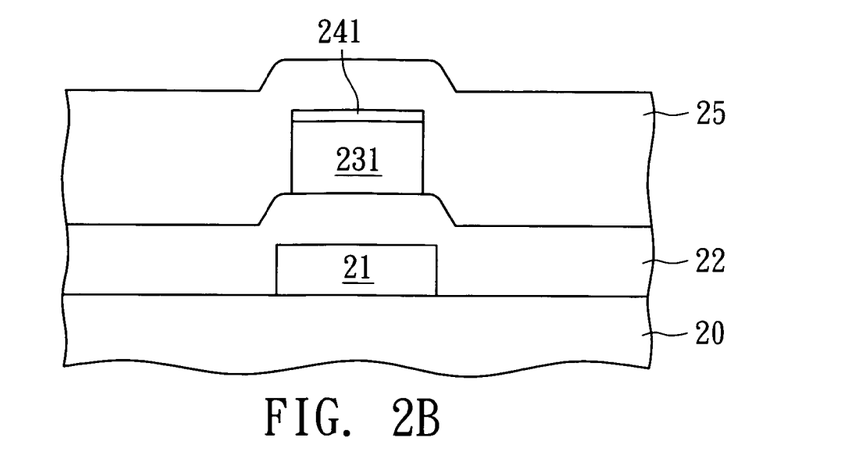

Next, the doped a-Si layer 24 and the a-Si layer 23 are patterned to form a doped a-Si region 241 and an a-Si region 231, respectively. A second metal layer 25 is further formed on the gate insulation layer 22 for covering the doped a-Si region 241 and the a-Si region 231, as shown in FIG. 2B. Also, the doped a-Si region 241 and the a-Si region 231 are positioned above the gate electrode 21. In this embodiment, the TFT having an island-in structure is taken for illustration. Thus, the bottom areas of the doped a-Si region 241 and the a-Si region 231 are smaller than that of the gate electrode 21, as depicted in FIG. 2B, for the purpose of reducing the photocurrent leakage from amorphous silicon after the TFT is exposed to the light.

Figure 2C:
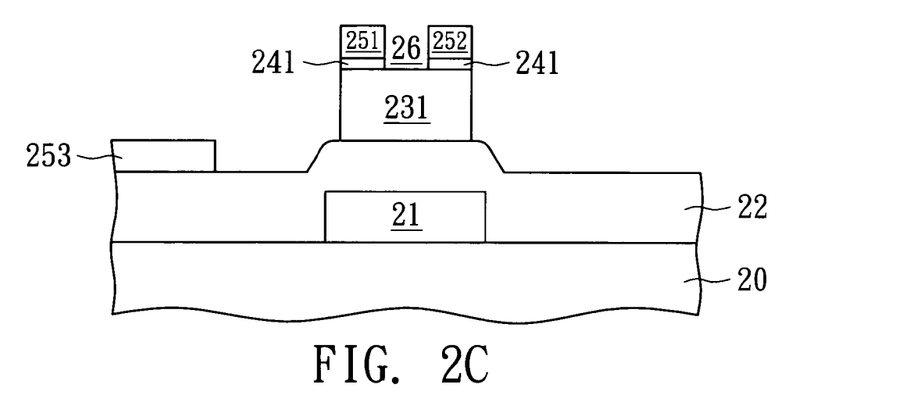

Then, the second metal layer 25 is patterned to form a source metal region 251, a drain metal region 252 and a data-line (DL) metal region 253, as shown in FIG. 2C. A channel region 26, separating the source metal region 251 and the drain metal region 252, exposes part of the surface of the a-Si region 231. Also, the DL metal region 253 and the source metal region 251 are spaced apart. In other words, the doped a-Si region 241 becomes discontinuous after the channel region 26 is formed.

It is noted that the source metal region 251 and the drain metal region 252 are separated formed on the doped a-Si region 241. Also, the source metal region 251 and the drain metal region 252 positioned above the gate electrode 21 are separated from the a-Si region 231 by the doped a-Si region 241.

Figure 2D:
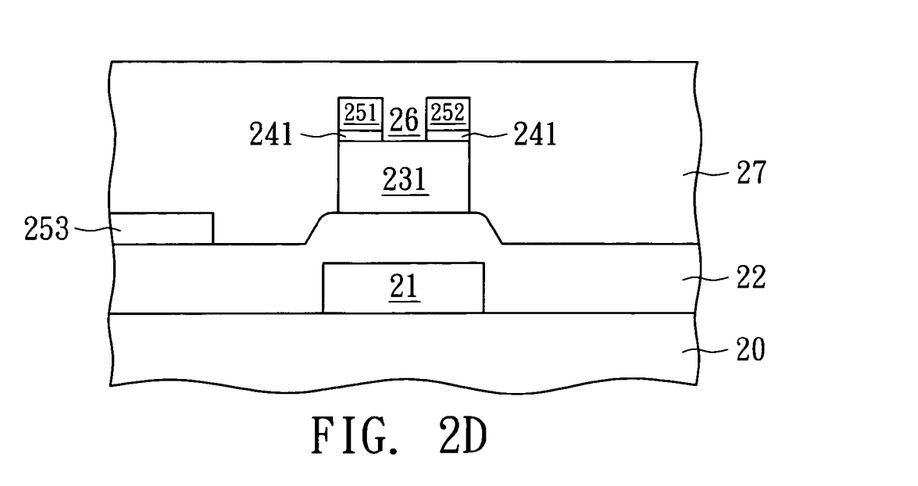

Then, a passivation layer 27 is formed on the gate insulation layer 22 to cover the source metal region 251, the drain metal region 252 and the DL metal region 253, as shown in FIG. 2D.

Figure 2E:
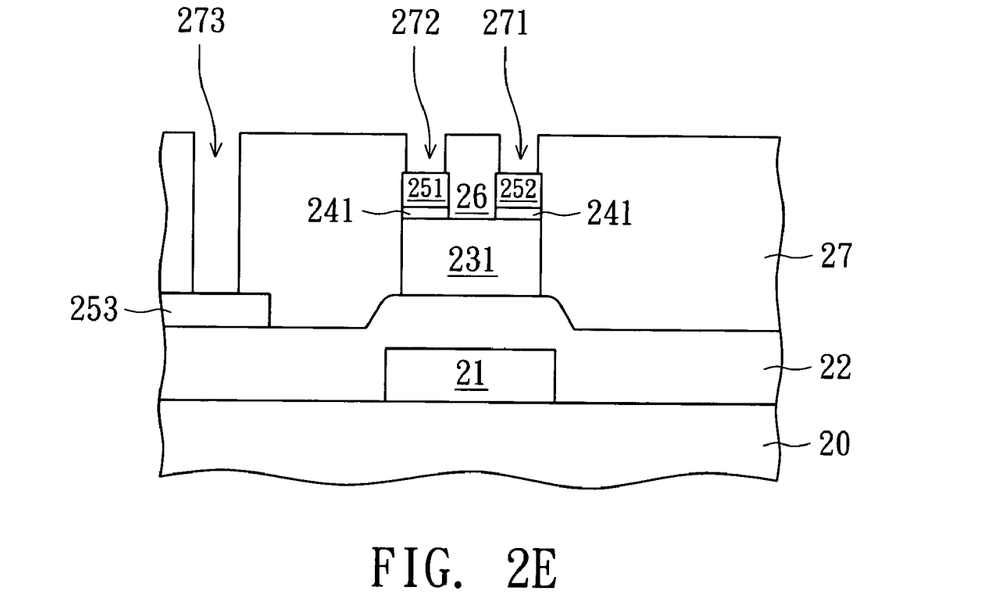

Next, as shown in FIG. 2E, a first via 271, a second via 272 and a third via 273 are formed in the passivation layer 27 for exposing the partial surfaces of the drain metal region 252, the source metal region 251 and the DL metal region 253, respectively.

Figure 2F:
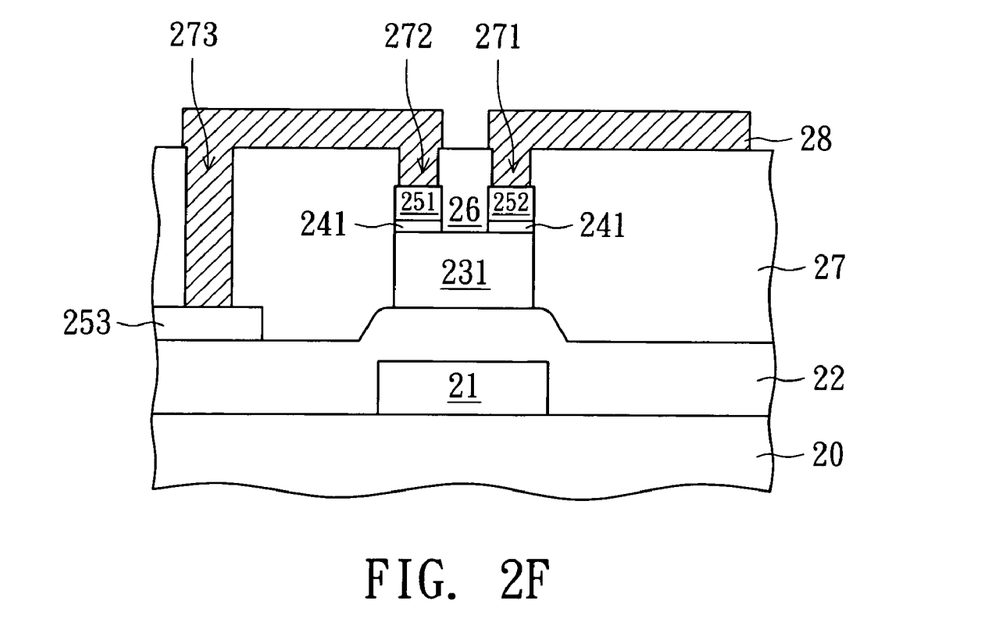

Finally, a conductive layer 28 is formed on the passivation layer 27, so that the first via 271, the second via 272 and the third via 273 are filled with the conductive layer 28, as shown in FIG. 2F. Accordingly, the DL metal region 253 and the source metal region 251 are electrically connected via the conductive layer 28. Practically, the conductive layer 28 can be made of indium tin oxide (ITO).

FIG. 2F is also a cross-sectional view of the thin film transistor (TFT) according to the first embodiment of the invention. In the first embodiment, the photocurrent leakage can be reduced since the doped a-Si region 241 and the a-Si region 231 (smaller than the gate electrode 21) are disposed as an island-in structure. Moreover, the source metal region 251 and the drain metal region 252 positioned above the gate electrode 21 are separated from the a-Si region 231, by the doped a-Si region 241, and the sidewalls of the a-Si region 231 direct contact the passivation layer 27. In the TFT of FIG. 2F, no "Schottky contact" (i.e. direct contact of a metal with a semiconductor) exists for creating a leakage current path. By applying the manufacturing method of the first embodiment, the current leakage the TFT is sufficiently decreased, and the on-and-off characteristic of the TFT has been greatly improved.

Second Embodiment

Figure 3A:
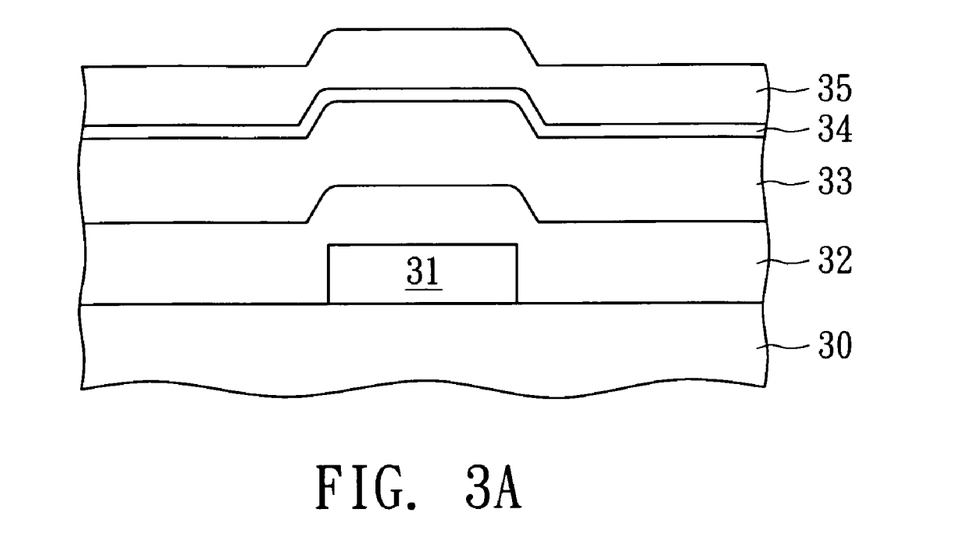

FIG. 3A~FIG. 3F schematically show the steps involved in the method of manufacturing the TFT according to the second embodiment of the invention. First, a substrate 30 is provided, and a gate electrode 31 is formed on the substrate 30. Then, a gate insulation layer 32 is formed on the substrate 30 to cover the gate electrode 31. An amorphous silicon (a-Si) layer 33 is further formed on the gate insulation layer 32, and a doped a-Si layer (such as the n+ a-Si layer) 34 is formed on the a-Si layer 23. Then, a second metal layer 35 is formed on the doped a-Si layer 34, as shown in FIG. 3A.

During the formation of the gate electrode 31, a first metal layer can be formed on the substrate 30 and then patterned to be the gate electrode 31. Practically, the gate insulation layer 32 can be made of silicon nitride.

Figure 3B:
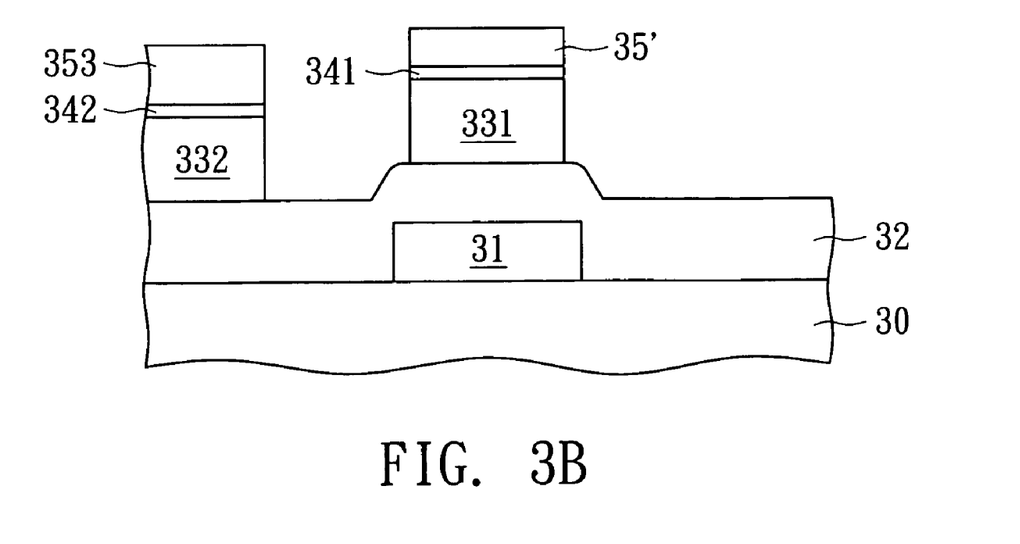

Next, the second metal layer 35, the doped a-Si layer 34 and the a-Si layer 33 are patterned. Thus, a data-line (DL) a-Si region 332, a doped DL metal region 342 and a DL metal region 353 are formed orderly, as shown in FIG. 3B. Also, an a-Si region 331, a doped a-Si region 341 and a second metal block 35' are formed above the gate electrode 31. In this embodiment, the width of the DL metal region 353 is identical to that of the DL a-Si region 332.

Figure 3C:
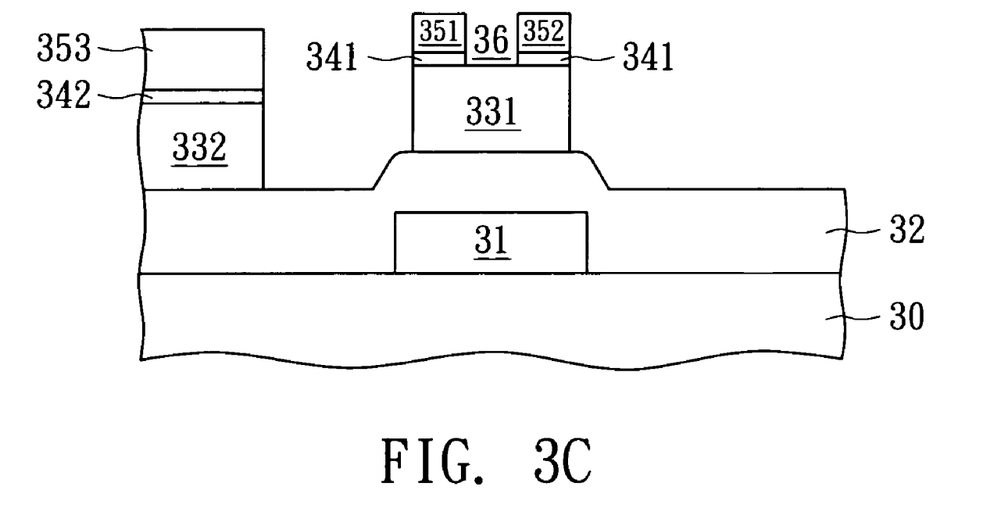

Then, the second metal block 35' is patterned to form a source metal region 351, a drain metal region 352 and a channel region 36, as shown in FIG. 3C. The channel region 36, separating the source metal region 351 and the drain metal region 352, exposes part of the surface of the a-Si region 331.

It is noted that the source metal region 351 and the drain metal region 352 are separated formed on the doped a-Si region 341. Also, the source metal region 351 and the drain metal region 352 positioned above the gate electrode 31 are separated from the a-Si region 331 by the doped a-Si region 341.

Also, the TFT of this embodiment has an island-in. The bottom areas of the doped a-Si region 341 and the a-Si region 331 are smaller than that of the gate electrode 31, as depicted in FIG. 3C. Thus, the photocurrent leakage from amorphous silicon can be reduced after the TFT is exposed to the light.

Figure 3D:
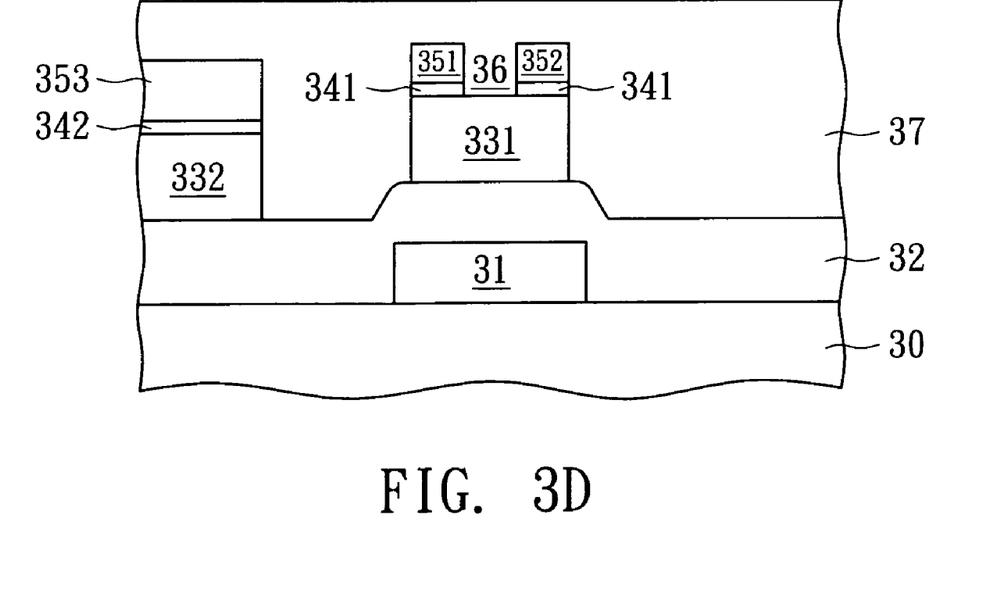

Then, a passivation layer 37 is formed on the gate insulation layer 32 to cover the source metal region 351, the drain metal region 352 and the DL metal region 353, as shown in FIG. 3D.

Figure 3E:
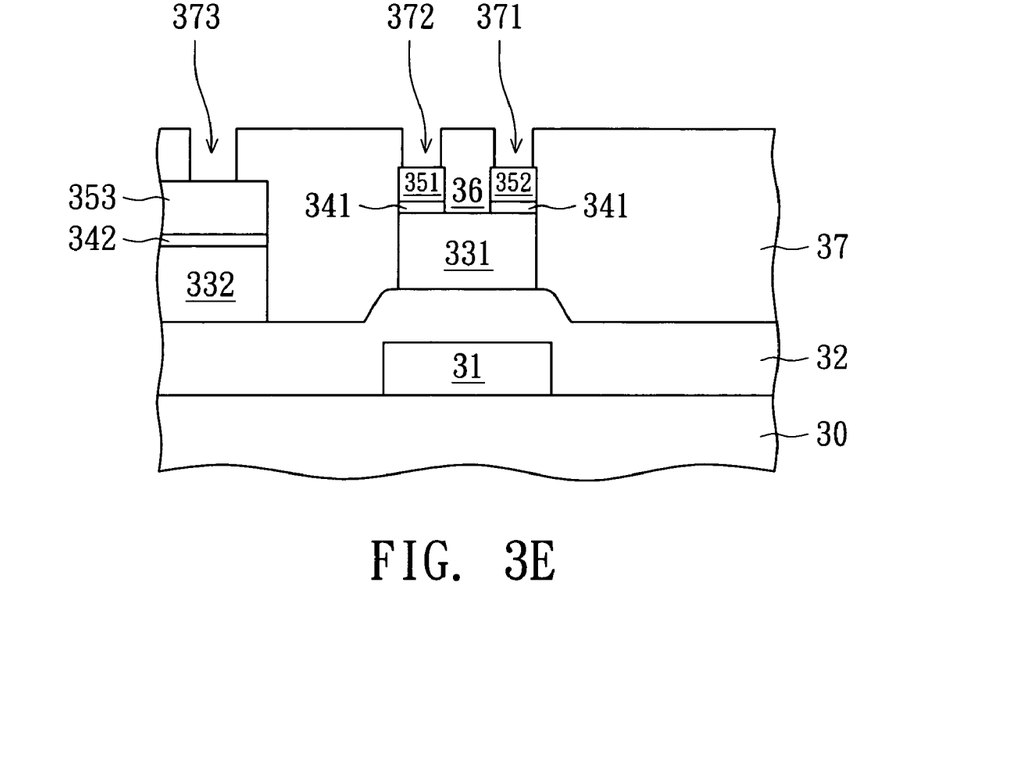

Next, as shown in FIG. 3E, a first via 371, a second via 372 and a third via 373 are formed in the passivation layer 37 for exposing the partial surfaces of the drain metal region 352, the source metal region 351 and the DL metal region 353, respectively.

Figure 3F:
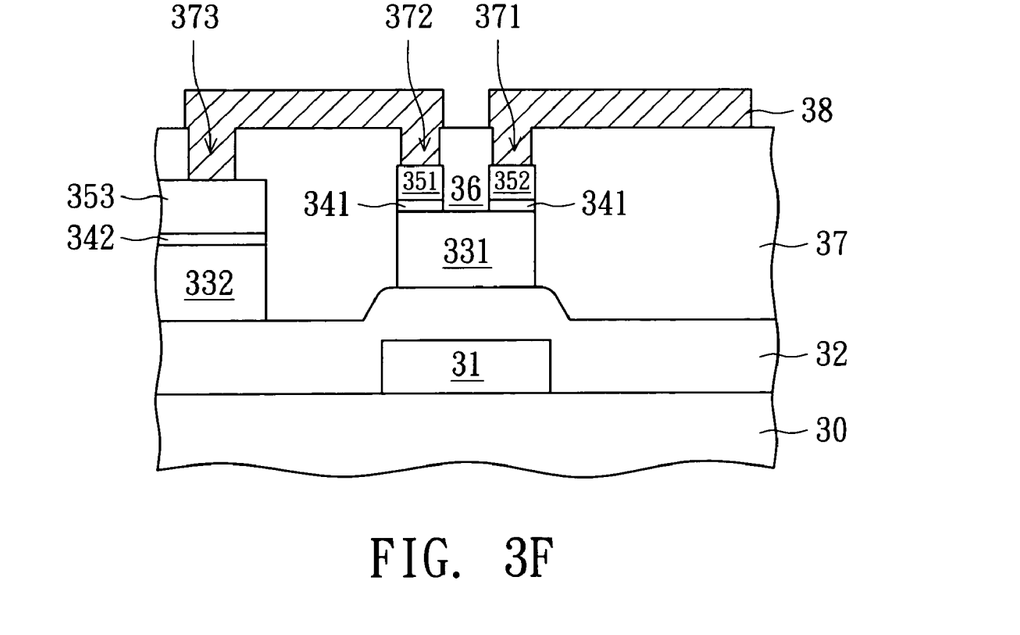

Finally, a conductive layer 38 is formed on the passivation layer 37, so that the first via 371, the second via 372 and the third via 373 are filled with the conductive layer 38, as shown in FIG. 3F. Accordingly, the DL metal region 353 and the source metal region 351 are electrically connected via the conductive layer 38. Practically, the conductive layer 38 can be made of indium tin oxide (ITO).

FIG. 3F is also a cross-sectional view of the thin film transistor (TFT) according to the second embodiment of the invention. In the second embodiment, the photocurrent leakage can be reduced since the doped a-Si region 341 and the a-Si region 331 (smaller than the gate electrode 31) are disposed as an island-in structure. Moreover, the source metal region 351 and the drain metal region 352 positioned above the gate electrode 31 are separated from the a-Si region 331 by the doped a-Si 341, and the sidewalls of the a-Si region 331 direct contact the passivation layer 37. Therefore, no "Schottky contact" (i.e. direct contact of a metal with a semiconductor) exists in the TFT of FIG. 3F for creating a leakage current path. By applying the manufacturing method of the second embodiment, the current leakage the TFT is sufficiently decreased, and the on-and-off characteristic of the TFT has been greatly improved.

While the invention has been described by way of examples and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A thin film transistor (TFT) for a displaying device, comprising:
    a gate electrode formed on a substrate;
    a gate insulation layer covering the gate electrode;
    an amorphous silicon (a-Si) region formed on the gate insulation layer and disposed above the gate electrode;
    a doped a-Si region formed on the a-Si region;
    a source metal region and a drain metal region, separately formed on a top surface of the doped a-Si region, each of the source and drain metal regions being disposed within the top surface of the doped a-Si region as an island, wherein the source metal region and drain metal region are separated from the a-Si region by the doped a-Si region, and a total area defined by the sum of a bottom area of the source metal region added to a bottom area of the drain metal region, is smaller than a bottom area of the a-Si region;
    a data line (DL) metal region formed on the gate insulation layer and spaced apart from the source metal region;
    a passivation layer formed on the gate insulation layer for covering the source metal region, the drain metal region and the DL metal region, the passivation layer having a first via, a second via and a third via for exposing partial surfaces of the drain metal region, partial surfaces of the source metal region and the DL metal region, respectively; and
    a conductive layer formed on the passivation layer for filling the first via, the second via and the third via, so that the DL metal region and the source metal region are electrically connected.

2. The TFT according to claim 1, further comprising a channel region disposed between the source and drain metal regions for separating the source metal region and the drain metal region, and exposing part of a surface of the a-Si region.

3. The TFT according to claim 2, wherein the channel region is filled with the passivation layer.

4. The TFT according to claim 1, wherein the bottom area of the a-Si region is smaller than a bottom area of the gate electrode.

5. The TFT according to claim 1, further comprising a data-line (DL) a-Si region, wherein the DL metal region is formed on the DL a-Si region.

6. The TFT according to claim 5, further comprising a doped DL a-Si region formed between the DL metal region and the DL a-Si region.

7. The TFT according to claim 1, wherein the first via and the second via are electrically isolated.

8. The TFT according to claim 1, wherein the gate insulation layer comprises a silicon nitride layer.

9. The TFT according to claim 1, wherein the conductive layer comprises an indium tin oxide (ITO) layer.

10. The TFT according to claim 1, wherein the bottom area of the source metal region added to the bottom area of the drain metal region is smaller than a bottom area of the gate electrode.

11. The TFT according to claim 1, wherein the source metal region and the doped a-Si region beneath have the same planar shape, while the drain metal region and the doped a-Si region beneath have the same planar shape.

12. The TFT according to claim 1, wherein a sidewall of the source metal region is aligned with a sidewall of the a-Si region, while a sidewall of the drain metal region is aligned with another sidewall of the a-Si region.

* * * * *